US012693344B2

(12) United States Patent
Kim et al.

(10) Patent No.: US 12,693,344 B2
(45) Date of Patent: Jul. 28, 2026

(54) BATTERY DIAGNOSIS METHOD, BATTERY DIAGNOSIS APPARATUS AND BATTERY SYSTEM FOR PROVIDING THE METHOD

(71) Applicant: LG ENERGY SOLUTION, LTD., Seoul (KR)

(72) Inventors: Dong Hyun Kim, Daejeon (KR); Hyo Seong An, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 192 days.

(21) Appl. No.: 18/687,657

(22) PCT Filed: Nov. 24, 2022

(86) PCT No.: PCT/KR2022/018716
§ 371 (c)(1),
(2) Date: Feb. 28, 2024

(87) PCT Pub. No.: WO2023/224195
PCT Pub. Date: Nov. 23, 2023

(65) Prior Publication Data
US 2024/0353498 A1 Oct. 24, 2024

(30) Foreign Application Priority Data
May 20, 2022 (KR) ........................ 10-2022-0061920

(51) Int. Cl.
*G01R 31/389* (2019.01)
*G01R 31/36* (2020.01)
(Continued)

(52) U.S. Cl.
CPC ....... *G01R 31/389* (2019.01); *G01R 31/3648* (2013.01); *G01R 31/374* (2019.01);
(Continued)

(58) Field of Classification Search
None
See application file for complete search history.

(56) References Cited

U.S. PATENT DOCUMENTS

| | | |
|---|---|---|
| 2008/0161946 A1 | 7/2008 | Kubota et al. |
| 2010/0045298 A1 | 2/2010 | Iwane et al. |

(Continued)

FOREIGN PATENT DOCUMENTS

| | | |
|---|---|---|
| GB | 2461350 A | 1/2010 |
| JP | 2008-167296 A | 7/2008 |

(Continued)

OTHER PUBLICATIONS

International Search Report (PCT/ISA/210) issued in PCT/KR2022/018716, dated Mar. 6, 2023.
(Continued)

*Primary Examiner* — Jas A Sanghera
(74) *Attorney, Agent, or Firm* — Birch, Stewart, Kolasch & Birch, LLP

(57) ABSTRACT

Discussed is a battery diagnosis apparatus that includes a measuring unit to measure a battery voltage at opposite ends of a battery, and a battery current flowing through the battery; a storage unit to store an internal resistance value of the battery calculated based on the battery voltage and the battery current at each diagnosis time point; and a control unit to calculate, for the each diagnosis time point, a moving average that is an average of a plurality of internal resistance values corresponding to a number of previously stored samples based on the diagnosis time point, and comparing the internal resistance value calculated for the each diagnosis time point with an upper band threshold that is larger than the moving average by a predetermined value and a lower band threshold that is smaller than the moving average by a predetermined value to diagnose a defect in the battery.

10 Claims, 5 Drawing Sheets

(51) Int. Cl.
    *G01R 31/374*        (2019.01)
    *G01R 31/3842*      (2019.01)
    *G01R 31/392*        (2019.01)
    *G01R 31/396*        (2019.01)

(52) U.S. Cl.
    CPC ....... *G01R 31/3842* (2019.01); *G01R 31/392*
          (2019.01); *G01R 31/396* (2019.01)

(56) References Cited

U.S. PATENT DOCUMENTS

| | | | |
|---|---|---|---|
| 2012/0147346 A1 | 6/2012 | Van Schoot et al. | |
| 2014/0277910 A1 | 9/2014 | Suh et al. | |
| 2018/0203070 A1 | 7/2018 | Park | |
| 2019/0081369 A1 | 3/2019 | Monden et al. | |
| 2020/0326378 A1* | 10/2020 | Oono | G01R 31/389 |
| 2021/0325477 A1 | 10/2021 | Imade et al. | |
| 2022/0146584 A1 | 5/2022 | Oono et al. | |
| 2022/0155371 A1 | 5/2022 | Kang et al. | |
| 2022/0404425 A1* | 12/2022 | Munakata | G01R 31/367 |

FOREIGN PATENT DOCUMENTS

| | | | |
|---|---|---|---|
| JP | 2008-256673 A | 10/2008 | |
| JP | 2012-129507 A | 7/2012 | |
| JP | 2014-10500 A | 1/2014 | |
| JP | 2014-177273 A | 9/2014 | |
| JP | 2015-31674 A | 2/2015 | |
| JP | 6180249 B2 | 8/2017 | |
| JP | 2018-189579 A | 11/2018 | |
| JP | 6571268 B2 | 9/2019 | |
| JP | 2020-9184 A | 1/2020 | |
| JP | 2020-54105 A | 4/2020 | |
| JP | 6791002 B2 | 11/2020 | |
| JP | 2021-97503 A | 6/2021 | |
| KR | 10-2021-0011235 A | 2/2021 | |
| KR | 10-2021-0054930 A | 5/2021 | |
| KR | 10-2021-0058717 A | 5/2021 | |
| KR | 10-2022-0001364 A | 1/2022 | |
| KR | 10-2022-0060814 A | 5/2022 | |
| WO | WO 2015/162259 A1 | 10/2015 | |
| WO | WO 2019/131741 A1 | 7/2019 | |

OTHER PUBLICATIONS

Extended European Search Report for European Application No. 22942858.6, dated Jan. 2, 2025.

\* cited by examiner

[FIG. 1]
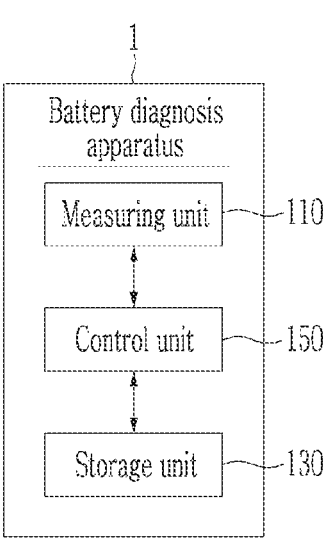

[FIG. 2]
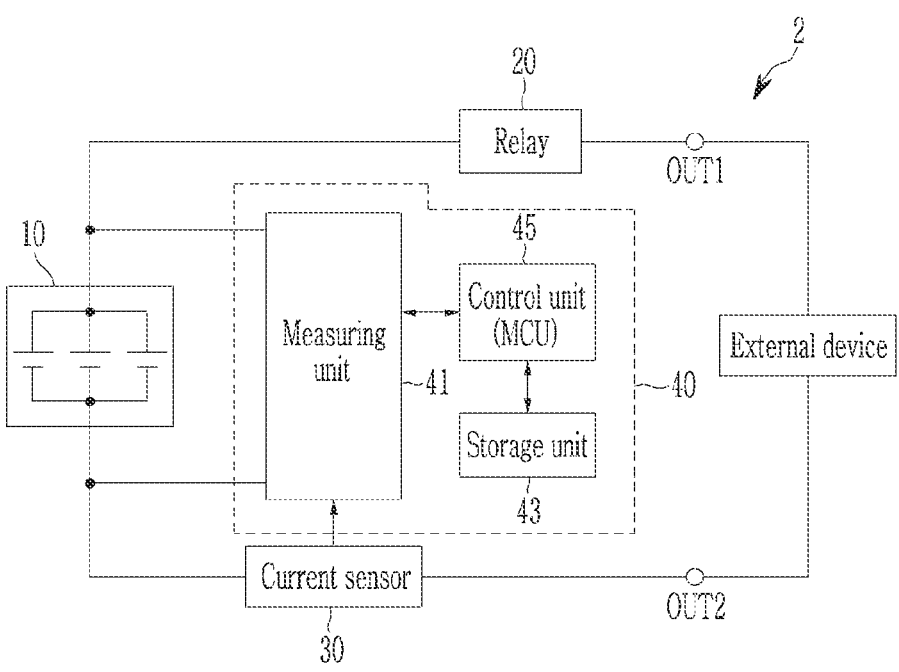

[FIG. 3]
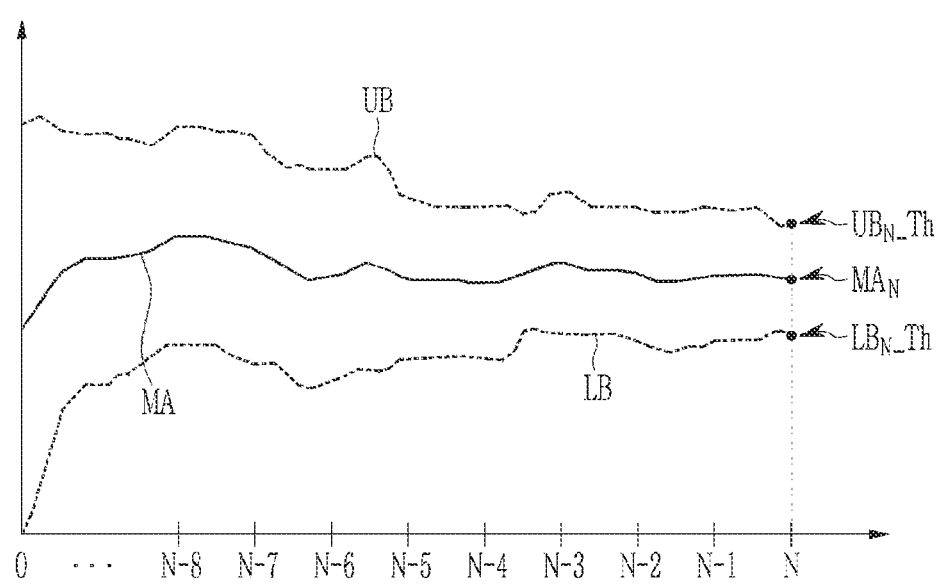

[FIG. 4]
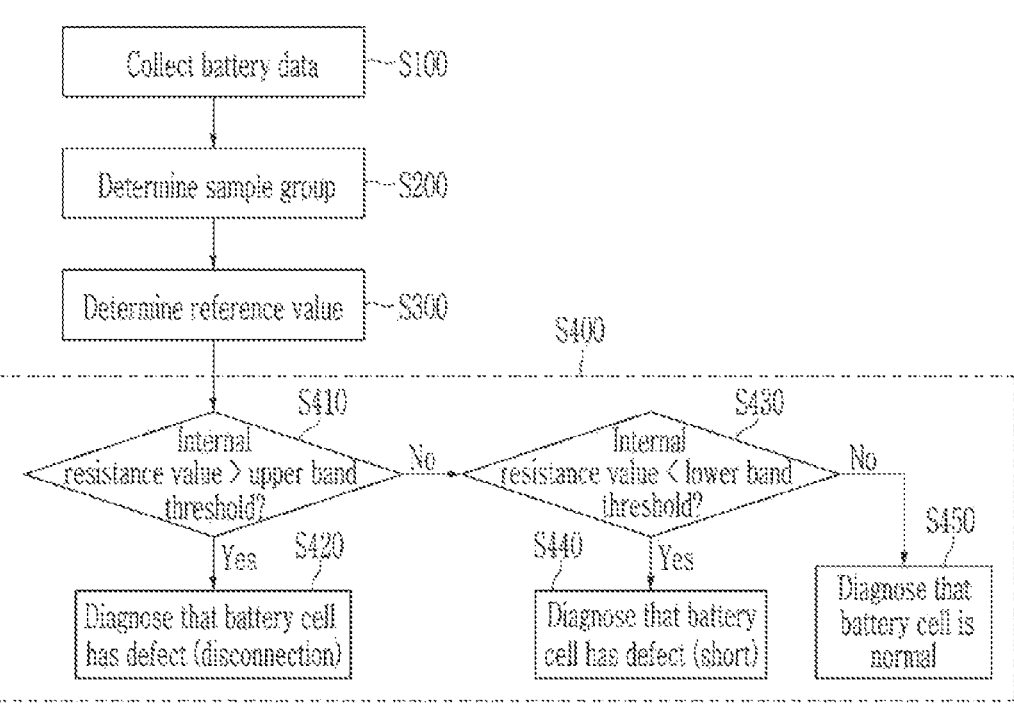

[FIG. 5]
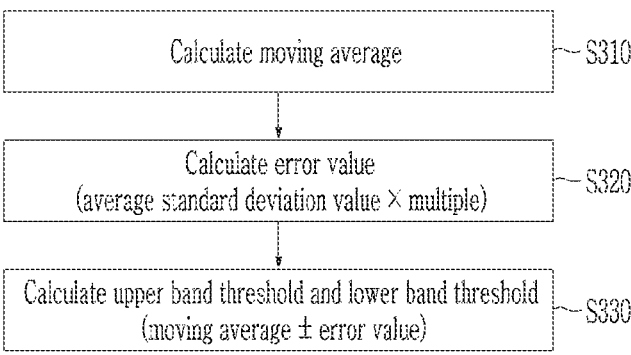

BATTERY DIAGNOSIS METHOD, BATTERY DIAGNOSIS APPARATUS AND BATTERY SYSTEM FOR PROVIDING THE METHOD

TECHNICAL FIELD

Cross-Reference to Related Application

This application claims priority to and the benefit of Korean Patent Application No. 10-2022-0061920 filed in the Korean Intellectual Property Office on May 20, 2022, the entire contents of which are incorporated herein by reference.

The present invention relates to a battery diagnosis method capable of diagnosing the state of a battery including a plurality of battery cells that are connected in parallel, and to a battery diagnosis apparatus and a battery system for providing the method.

BACKGROUND ART

Large batteries mounted on electric vehicles, energy storage batteries, robots, satellites, and the like are required to have a higher capacity than small batteries mounted on portable terminals, laptop computers, and the like. A high-capacity battery may be configured by connecting a plurality of batteries in series and/or in parallel. In this case, the plurality of batteries may include a plurality of battery cells connected in parallel.

Meanwhile, when the number of battery cells included in a battery increases, defects may occur in the battery due to problems in the battery cells themselves and/or problems in connection between battery cells. For example, defects, such as disconnection and short circuit, between battery cells may occur. When a defect occurs in a battery. it is necessary to enable a system (for example, a vehicle, and an energy storage device) in which the battery is mounted to operate normally through quick diagnosis and correction of the defect.

However, when a plurality of battery cells is connected in parallel, it is not easy to directly sense a cell voltage or the like of an individual battery cell due to a structural problem in connection and the like. That is, it is difficult to diagnose defects of the entire battery by directly estimating defects of the battery cells themselves.

In addition, a technology for diagnosing a defect in a battery by estimating Direct Current Internal Resistance (DCIR) on a battery basis and comparing the estimated DCIR value with a preset (fixed) reference value has a limitation in not detecting a defect when a plurality of battery cells in a battery is disconnected or shorted at the same time. In addition, a problem of erroneously diagnosing the degree of change in the DC internal resistance value according to aging as occurrence of a defect.

DISCLOSURE

Technical Problem

The present invention is conceived to solve the above problems, and provides a battery diagnosis method capable of precisely diagnosing the state of a battery including a plurality of battery cells that are connected in parallel, and a battery system providing the method.

Technical Solution

A battery diagnosis apparatus according to an embodiment of the present invention includes: a measuring unit configured to measure a battery voltage at opposite ends of a battery including a plurality of battery cells, and a battery current flowing through the battery; a storage unit configured to store an internal resistance value of the battery that is calculated based on at least one of the battery voltage and the battery current at each diagnosis time point; and a control unit configured to extract a plurality of previous diagnosis time points corresponding to a predetermined number of samples based on a diagnosis time point for the each diagnosis time point, calculate a moving average that is an average of a plurality of internal resistance values corresponding to the plurality of diagnosis time points, respectively, the plurality of internal resistance value including the internal resistance value, and compare the internal resistance value with an upper band threshold that is larger than the moving average by a predetermined value and a lower band threshold that is smaller than the moving average by a predetermined value to diagnose a defect in the battery.

The control unit may calculate an error value by multiplying a standard deviation average value, which is an average of a plurality of standard deviations corresponding to the plurality of diagnosis time points, respectively, by a predetermined multiple, calculate the upper band threshold by adding the error value to the moving average, and calculate the lower band threshold by subtracting the error value from the moving average.

When the internal resistance value exceeds the upper band threshold, the control unit may diagnose that a disconnection defect has occurred in at least one of the plurality of battery cells.

When the internal resistance value is less than the lower band threshold, the control unit may diagnose that a short defect has occurred in at least one of the plurality of battery cells.

When the internal resistance value is within a range that is equal to or greater than the lower band threshold and is equal to or less than the upper band threshold, the control unit may diagnose that the plurality of battery cells is in a normal state.

A battery system according to another embodiment of the present invention includes: a battery including a plurality of battery cells; a measuring unit configured to measure a battery voltage at opposite ends of the battery, and a battery current flowing through the battery; a storage unit configured to store an internal resistance value of the battery calculated based on the battery voltage and the battery current at each diagnosis time point; and a control unit configured to extract a plurality of previous diagnosis time points corresponding to a predetermined number of samples based on a diagnosis time point for the each diagnosis time point, calculate a moving average that is an average of a plurality of internal resistance values corresponding to the plurality of diagnosis time points, respectively, the plurality of internal resistance values including the internal resistance value, and compare the internal resistance value with an upper band threshold that is larger than the moving average by a predetermined value and a lower band threshold that is smaller than the moving average by a predetermined value to diagnose a defect in the battery.

The control unit may further calculate an error value by multiplying a standard deviation average value, which is an average of a plurality of standard deviations corresponding to the plurality of diagnosis time points, respectively, by a predetermined multiple, calculate the upper band threshold by adding the error value to the moving average, and calculate the lower band threshold by subtracting the error value from the moving average.

When the internal resistance value exceeds the upper band threshold, the control unit may diagnose that a disconnection defect has occurred in at least one of the plurality of battery cells.

When the internal resistance value is less than the lower band threshold, the control unit may diagnose that a short defect has occurred in at least one of the plurality of battery cells.

A battery diagnosing method according to still another embodiment of the present invention includes: a battery data collecting operation of collecting a measurement value of each of a battery voltage at opposite ends of a battery including a plurality of battery cells, and a battery current flowing through the battery; a sample group determining operation of extracting, at a predetermined diagnosis time point, a plurality of diagnosis time points previously obtained and corresponding to a number of samples based on the predetermined diagnosis time point; a reference value determining operation of calculating a moving average, which is an average of a plurality of internal resistance values corresponding to the plurality of diagnosis time points, respectively, an upper band threshold larger than the moving average by a predetermined value, and a lower band threshold smaller than the moving average by a predetermined value; and a defect diagnosis operation of diagnosing a defect in the battery by comparing an internal resistance value corresponding to the predetermined diagnosis time point with the upper band threshold and the lower band threshold, from among the plurality of internal resistance values.

The reference value determining operation may include calculating an error value by multiplying a standard deviation average value, which is an average of a plurality of standard deviations corresponding to the plurality of diagnosis time points, respectively, by a predetermined multiple, calculating the upper band threshold by adding the error value to the moving average, and calculating the lower band threshold by subtracting the error value from the moving average.

The defect diagnosing operation may include, when the internal resistance value exceeds the upper band threshold, diagnosing that a disconnection defect has occurred in at least one of the plurality of battery cells.

the defect diagnosing operation may include, when the internal resistance value is less than the lower band threshold, diagnosing that a short defect has occurred in at least one of the plurality of battery cells.

Advantageous Effects

According to the present invention, even when a plurality of battery cells is connected in parallel, it is possible to diagnose a battery defect with high precision.

Unlike the prior art of diagnosing a defects in a battery by using a fixed reference value, the present invention diagnoses the battery defect by setting a reference value that reflects the change in the battery's internal resistance value at each diagnosis time point for diagnosing the battery defect, so that the degree of deterioration according to the period of use of the battery is considered, thereby diagnosing the defect in the battery with high precision.

DESCRIPTION OF THE DRAWINGS

FIG. 1 is a diagram illustrating a battery diagnosis apparatus according to an exemplary embodiment.

FIG. 2 is a diagram illustrating a battery system according to another exemplary embodiment.

FIG. 3 is an exemplary diagram in which a moving average, an upper band threshold, and a lower band threshold calculated for each of a plurality of diagnosis time points are accumulated and displayed.

FIG. 4 is a flowchart illustrating a battery diagnosis method according to an exemplary embodiment.

FIG. 5 is a flowchart illustrating a reference value determining operation S300 of FIG. 4 in detail.

MODE FOR INVENTION

Hereinafter, an exemplary embodiment disclosed the present specification will be described in detail with reference to the accompanying drawings, and the same or similar constituent element is denoted by the same reference numeral regardless of a reference numeral, and a repeated description thereof will be omitted. Suffixes, "module" and and/or "unit" for a constituent element used for the description below are given or mixed in consideration of only easiness of the writing of the specification, and the suffix itself does not have a discriminated meaning or role. Further, in describing the exemplary embodiment disclosed in the present disclosure, when it is determined that detailed description relating to well-known functions or configurations may make the subject matter of the exemplary embodiment disclosed in the present disclosure unnecessarily ambiguous, the detailed description will be omitted. Further, the accompanying drawings are provided for helping to easily understand exemplary embodiments disclosed in the present specification, and the technical spirit disclosed in the present specification is not limited by the accompanying drawings, and it will be appreciated that the present invention includes all of the modifications, equivalent matters, and substitutes included in the spirit and the technical scope of the present invention.

Terms including an ordinary number, such as first and second, are used for describing various constituent elements, but the constituent elements are not limited by the terms. The terms are used only to discriminate one constituent element from another constituent element.

It should be understood that when one constituent element is referred to as being "coupled to" or "connected to" another constituent element, one constituent element can be directly coupled to or connected to the other constituent element, but intervening elements may also be present. By contrast, when one constituent element is referred to as being "directly coupled to" or "directly connected to" another constituent element, it should be understood that there are no intervening elements.

In the present application, it will be appreciated that terms "including" and "having" are intended to designate the existence of characteristics, numbers, operations, operations, constituent elements, and components described in the specification or a combination thereof, and do not exclude a possibility of the existence or addition of one or more other characteristics, numbers, operations, operations, constituent elements, and components, or a combination thereof in advance.

FIG. 1 is a diagram illustrating a battery diagnosis apparatus according to an exemplary embodiment.

Referring to FIG. 1, a battery diagnosis apparatus 1 includes a measuring unit 110, a storage unit 130, and a control unit 150.

The measuring unit 110 may measure a battery voltage, which is the voltage at both ends of the battery, and a battery current, which is the current flowing through the battery. The battery voltage and the battery current may be battery data required to calculate internal resistance of the battery. For example, the internal resistance may include Direct Current Internal Resistance (DCIR).

The measuring unit 110 may include a voltage sensor (not illustrated) electrically connected to both ends of the battery to measure the battery voltage and a current sensor (not illustrated) connected in series to the battery to measure the battery current. For example, the measuring unit 110 may measure a battery voltage and a battery current at each diagnosis time point for diagnosing a defect in the battery, and transmit the measurement result to the control unit 150.

The storage unit 130 may store an internal resistance value calculated by the control unit 150 based on at least one of a battery voltage and a battery current at each diagnosis time point for diagnosing a defect in the battery. In addition, the control unit 150 may store the battery voltage value and the battery current value received from the measuring unit 110 in the storage unit 130 at each diagnosis time point for diagnosing a defect in the battery.

When a diagnosis time point N according to a preset condition arrives, the control unit 150 calculates a moving average MA, an upper band threshold UB_Th which is larger than the moving average by a predetermined value, a lower band threshold LB_Th which is smaller than the moving average by a predetermined value, and an internal resistance value corresponding to the diagnosis time point N.

of a plurality of diagnosis time points included in the sample group, and may be determined as an optimal number based on an experiment or the like. The sample group is a subgroup of a plurality of past diagnosis time points, which is a population, and may be a group for calculating a moving average MA and an standard deviation average value σ_ave, which will be described below.

Hereinafter, Table 1 is an example of the internal resistance DCIR value, the moving average MA, the upper band threshold UB_Th, and the lower band threshold LB_Th calculated at each of a plurality of diagnosis time points. It is assumed that the number of samples SN is 5.

For reference, in Table 1, it may be difficult to directly calculate a moving average MA, a standard deviation σ, an standard deviation average value σ_ave, an upper band threshold UB_Th, and a lower band threshold LB_Th of the first diagnosis time point 1 (therefore, the corresponding values in Table 1 are marked with blanks). In addition, it may also be difficult to directly calculate moving averages MA, standard deviations σ, standard deviation average values σ_ave, upper band thresholds UB_Th, and lower band thresholds LB_Th at diagnosis time points 2, 3, . . . adjacent to the first diagnosis time point 1 because there are no or insufficient past diagnostic values for calculation. In this case, the values calculated on average according to the experiment may be replaced with the moving averages MA, standard deviations σ, the standard deviation average value values σ_ave, the upper band thresholds UB_Th, and the lower band thresholds LB_Th at the first diagnosis time points 1, 2, 3, . . . .

TABLE 1

| Diagnosis period | 1 | . . . | N-7 | N-6 | N-5 | N-4 | N-3 | N-2 | N-1 | N |
|---|---|---|---|---|---|---|---|---|---|---|
| Internal resistance (DCIR) | | . . . | 25 | 27 | 23 | 24 | 20 | 21 | 23 | ① |
| Moving average (MA) | | . . . | 22.5 | 21 | 22 | 23.5 | 23 | 22 | 24 | ② |
| Standard deviation (σ) | | . . . | 1.56 | 1.60 | 1.70 | 1.60 | 1.82 | 1.73 | 1.63 | ③ |
| Average standard deviation (σ_ave) | | . . . | 1.55 | 1.62 | 1.65 | 1.62 | 1.70 | 1.65 | 1.55 | ④ |
| Upper band threshold (UB_Th) | | . . . | 27.15 | 26.20 | 26.95 | 27.90 | 28.1 | 26.95 | 28.65 | ⑤ |
| Lower band threshold (LB_Th) | | . . . | 17.85 | 15.8 | 17.05 | 19.1 | 17.9 | 17.05 | 19.35 | ⑥ |
| Diagnosis result | | | Normal | Abnormal | Normal | Normal | Normal | Normal | Normal | ⑦ |

Depending on the exemplary embodiment, a time point at which charging of the battery starts or a time point at which discharging of the battery ends may be a diagnosis time point N for diagnosing a defect in the battery. When the diagnosis time point N arrives, the measuring unit 110 may measure each of a battery voltage and a battery current at a predetermined cycle for a predetermined period of time, and transmit the measurement results to the control unit 150.

First of all, the control unit 150 may extract a plurality of diagnosis time points included in the preset number of samples SN when counting the diagnosis time points in the direction of the previous diagnosis time point based on the current diagnosis time point N and determine a sample group. In this case, the number of samples SN is the number When the control unit 150 counts the diagnosis time point in the direction of the previous diagnosis time point based on the current diagnosis time point N, the control unit 150 may extract an $N-1^{th}$ diagnosis time point, an $N-2^{th}$ diagnosis time point, an $N-3^{th}$ diagnosis time point, an $N-4^{th}$ diagnosis time point, and an $N-5^{th}$ diagnosis time point corresponding to the sample number SN of 5, and determine the sample group.

The control unit 150 may determine a sample group by extracting a plurality of diagnosis time points (N−1, N−2, N−3, N−4, and N−5), and determine reference values (upper and lower band thresholds to be described below) used for defect diagnosis based on the internal resistance value calculated at each of the plurality of diagnosis time points belonging to the sample group. Then, it is possible to solve the problem of misdiagnosing the degree of aging due to long-term use of the battery and/or the temporary change in internal resistance value as a defect of the battery.

Next, the control unit 150 determines the reference values (upper and lower band thresholds) for diagnosing defects in the battery at the $N^{th}$ diagnosis time point based on the internal resistance value calculated in each of the plurality of diagnosis time points N–5, N–4, N–3, N–2, and N–1 belonging to the sample group.

According to the exemplary embodiment, the control unit 150 compares a value of the internal resistance $DCIR_N$ corresponding to the $N^{th}$ diagnosis time point N with the upper band threshold $UB_N\_Th$ and the lower band threshold $LB_N\_Th$ to diagnose a defect in the battery. For example, referring to Table 1, at the $N^{th}$ diagnosis time point N, the control unit 150 calculates the internal resistance value (①), the upper band threshold (⑤) and the lower band threshold (⑥), and compare the calculated internal resistance value (①) with the upper band threshold (⑤) and the lower band threshold (⑥) to diagnose the defect of the battery. In this case, in order to calculate the upper band threshold (⑤) and the lower band threshold (⑥), the moving average (②) and the standard deviation average value (④) are required. However, the standard deviation (③) is not a value necessary for defect diagnosis at the $N^{th}$ diagnosis time point N, flowing through the battery and the voltage difference ΔV. For example, it is assumed that the internal resistance $DCIR_N$ value corresponding to the $N^{th}$ diagnosis time point N is calculated as 30Ω.

Referring to Table 1, the control unit 150 may calculate an moving average $MA_N$ (②) corresponding to the diagnosis time point N by averaging (23Ω+24Ω+20Ω+21Ω+23Ω/5=22.2 Ω) the plurality of internal resistance values (23Ω, 24Ω, 20Ω, 21Ω, and 23Ω) corresponding to the plurality of diagnosis time points (N–5, N–4, N–3, N–2, and N–1), respectively, belonging to the sample group. That is, the internal resistance $DCIR_N$ value corresponding to the $N^{th}$ diagnosis time point may be 22.2Ω.

$$MA_N = \frac{\begin{array}{c}DCIR_{N-5} + DCIR_{N-4} + \\ DCIR_{N-3} + DCIR_{N-2} + DCIR_{N-1}\end{array}}{SN} \qquad \text{Equation 2}$$

Referring to Table 2 below, the control unit 150 may calculate a standard deviation $\sigma_N$ (③) corresponding to the diagnosis time point N based on the internal resistance value DCIR and moving average MA corresponding to each of the plurality of diagnosis time points N–5, N–4, N–3, N–2, and N–1 belonging to the sample group.

TABLE 2

| | N-5 | N-4 | N-3 | N-2 | N-1 | N |
|---|---|---|---|---|---|---|
| Internal resistance (DCIR) | 23 | 24 | 20 | 21 | 23 | |
| \|DCIR – MA\| | \|23 – 22.2\| = 0.8 | \|24 – 22.2\| = 1.8 | \|20 – 22.2\| = 2.2 | \|21 – 22.2\| = 1.2 | \|23 – 22.2\| = 0.8 | |
| (DCIR – MA)² | (0.8)² = 0.64 | (1.8)² = 3.24 | (2.2)² = 4.84 | (1.2)² = 1.44 | (0.8)² = 0.64 | |
| Variance | (0.64 + 3.24 + 4.84 + 1.44 + 0.64)/5 = 2.16 | | | | | |
| Standard deviation ($\sigma_H$) | $\sqrt{2.16}$ = 1.4606938457(=1.47) | | | | | 1.47 | but is necessary for defect diagnosis at the next diagnosis time points N+1, N+2, . . . , so that the standard deviation (③) may be calculated at the $N^{th}$ diagnosis time point and stored in the storage unit 130.

Hereinafter, the internal resistance value (①), the moving average (②), the standard deviation (③), the standard deviation average value (④), the upper band threshold (⑤), and the lower band threshold (⑥) calculated by the control unit 150 at the $N^{th}$ diagnosis time point N in Table 1 will be described.

The control unit 150 may calculate the internal resistance $DCIR_N$ value corresponding to the $N^{th}$ diagnosis time point N based on the battery voltage, which is the voltage of the both ends of the battery, and the battery current, which is the current flowing through the battery. For example, the value of the internal resistance $DCIR_N$ (①) may be calculated by Equation (1) below.

$$DCIR_N = \frac{\Delta V}{I} \qquad \text{Equation 1}$$

For example, the control unit 150 may calculate a voltage difference (ΔV=|V1–V2|) between a battery voltage V1 corresponding to a first time point when charging starts and a battery voltage V2 corresponding to a second time point after a predetermined time has elapsed from the first time point. The control unit 150 may calculate the internal resistance $DCIR_N$ value based on the charging current I As described above, the standard deviation $\sigma_N$ (③) corresponding to the $N^{th}$ diagnosis time point N is not a value necessary for defect diagnosis at the $N^{th}$ diagnosis time point N, but is necessary when defects are diagnosed at the next diagnosis time points N+1, N+2, and . . . . Accordingly, the standard deviation $\sigma_N$ (③) corresponding to the $N^{th}$ diagnosis time point N may be calculated at the $N^{th}$ diagnosis time point N and stored in the storage unit 130.

Referring to Table 3 below, the control unit 150 may calculate an standard deviation average value $\sigma_{N\_ave}$ (④) corresponding to the $N^{th}$ diagnosis time point N based on the plurality of standard deviations $\sigma_{N-5}$, $\sigma_{N-4}$, $\sigma_{N-3}$, $\sigma_{N-2}$, and $\sigma_{N-1}$ corresponding to the plurality of diagnosis time points N–5, N–4, N–3, N–2, and N–1, respectively, belonging to the sample group.

TABLE 3

| | N-5 | N-4 | N-3 | N-2 | N-1 | N |
|---|---|---|---|---|---|---|
| Standard deviation (σ) | 1.70 | 1.60 | 1.82 | 1.73 | 1.63 | |
| Average standard deviation ($\sigma_H$) | (1.70 + 1.60 + 1.82 + 1.73 + 1.63)/5 = 1.696 | | | | | 1.70 |

The control unit 150 may calculate an upper band threshold $UB_N\_Th$ that is larger than the moving average MAN by a predetermined value and a lower band threshold $LB_N\_Th$ that is smaller than the moving average MA by a predetermined value. According to the exemplary embodiment, the control unit 150 may calculate a first error value by multiplying the standard deviation average value $\sigma_{N\_ave}$ by a predetermined first multiple, and calculate the upper band threshold $UB_N\_Th$ by adding the first error value to the moving average MAN. In addition, the control unit 150 may calculate a second error value by multiplying the standard deviation average value $\sigma_{N\_ave}$ by a predetermined second multiple, and calculate the lower band threshold $LB_N\_Th$ by subtracting the second error value from the moving average MAN. In this case, the first multiple and the second multiple may be the same, but are not limited thereto, and the error value may be calculated as various multiples.

According to the exemplary embodiment, the control unit 150 may calculate an error value ($E=\sigma_{N\_ave}\times Q$) by multiplying the standard deviation average value $\sigma_{N\_ave}$ by a predetermined multiple Q. In this case, the multiple Q is a value for reflecting a predetermined error, and may be determined by various values through experiments. For example, it is assumed that the multiple Q is the natural number 3.

The control unit 150 may calculate the upper band threshold $UB_N\_Th$ of 27.3 by adding the error value ($E=\sigma_{N\_ave}\times Q=1.70\times3=5.1$) to the moving average ($MA_N=22.2$) of the sample group as illustrated in Equation 3 below. In addition, the control unit 150 may calculate the lower band threshold $LB_N\_Th$ of 17.1 by subtracting the error value ($E=\sigma_{N\_ave}\times Q=1.70\times3=5.1$) from the moving average ($MA_N=22.2$) of the sample group as illustrated in Equation 4 below.

$$UB_N\_Th = MA_N + (\sigma_N\_ave \times Q) \qquad \text{Equation 3}$$

$$LB_N\_Th = MA_N + (\sigma_N\_ave \times Q) \qquad \text{Equation 4}$$

Next, the control unit 150 may compare the value of the internal resistance $DCIR_N$ corresponding to the $N^{th}$ diagnosis time point N with the upper band threshold $UB_N\_Th$ and the lower band threshold $LB_N\_Th$ corresponding to the $N^{th}$ diagnosis time point to diagnose a defect in the battery.

According to the exemplary embodiment, when the internal resistance $DCIR_N$ value exceeds the upper band threshold $UB_N\_Th$, the control unit 150 may diagnose that a disconnection defect (DD) has occurred in at least one of a plurality of battery cells included in the battery. When the value of the internal resistance $DCIR_N$ value is less than the lower band threshold $LB_N\_Th$, the control unit 150 may diagnose that a short defect (SD) has occurred in at least one of a plurality of battery cells included in the battery. That is, when the value of the internal resistance $DCIR_N$ value is out of the normal range corresponding to the lower band threshold $LB_N\_Th$ or more and the upper band threshold $UB_N\_Th$ or less, the control unit 150 may diagnose that a defect (disconnection defect or short defect) has occurred in the battery. In addition, when the value of the internal resistance $DCIR_N$ value falls within the normal range, the control unit 150 may diagnose the state of the battery as normal.

For example, as described above through Tables 1 and 3 and Equations 1 to 4, the internal resistance $DCIR_N$ value, the upper band threshold $UB_N\_Th$, and the lower band threshold $LB_N\_Th$ corresponding to the $N^{th}$ diagnosis time point N may be calculated as 30Ω, 27.3, and 17.1, respectively. In this case, the control unit 150 may diagnose a battery defect (disconnection defect) based on the fact that the internal resistance value ($DCIR_N=30$) exceeds the upper band threshold ($UB_N\_Th=27.3$).

FIG. 2 is a diagram illustrating a battery system according to another exemplary embodiment.

Referring to FIG. 2, a battery system 2 includes a battery 10, a relay 20, a current sensor 30, and a battery management system (BMS) 40.

The battery 10 may include a plurality of battery cells connected in series and/or in parallel. In FIG. 2, three battery cells connected in parallel are illustrated, but the present invention is not limited thereto, and the battery 10 may include various numbers of battery cells connected in series and/or in parallel. In some exemplary embodiments, the battery cell may be a rechargeable secondary battery.

For example, in the battery 10, a predetermined number of battery cells is connected in parallel to form a battery bank, and a predetermined number of battery banks is connected in series to form a battery pack to supply desired power to an external device. For another example, in the battery 10, a predetermined number of battery cells is connected in parallel to form a battery bank, and a predetermined number of battery banks is connected in parallel to form a battery pack to supply desired power to an external device. However, the present invention is not limited to this connection, and the battery 10 may include a plurality of battery banks including a plurality of battery cells connected in series and/or parallel, and the plurality of battery banks may also be connected in series and/or parallel.

In FIG. 2, the battery 10 is connected between the two output terminals OUT1 and OUT2 of the battery system 2. In addition, the relay 20 is connected between a positive electrode of the battery system 2 and the first output terminal OUT1, and the current sensor 30 is connected between a negative electrode of the battery system 2 and the second output terminal OUT2. The configurations illustrated in FIG. 2 and the connection relationship between the configurations are examples, but the invention is not limited thereto.

The relay 20 controls electrical connection between the battery system 2 and an external device. When the relay 20 is turned on, the battery system 2 and the external device are electrically connected to perform charging or discharging, and when the relay 20 is turned off, the battery system 2 and the external device are electrically separated. In this case, the external device may be a charger in a charging cycle in which power is supplied to the battery 10 for charging, and may be a load in a discharging cycle in which the battery 10 discharges power to the external device.

The current sensor 30 is connected in series to a current path between the battery 10 and an external device. The current sensor 30 may measure the battery current flowing through the battery 10, that is, a charging current and a discharging current, and transmit the measurement result to the BMS 40.

The BMS 40 includes a measuring unit 41, a storage unit 43, and a control unit 45. The battery diagnosis apparatus 1 illustrated in FIG. 1 may correspond to the BMS 40 illustrated in FIG. 2. Specifically, the functions performed by the measuring unit 110, the storage unit 130, and the control unit 150 of the battery diagnosis apparatus 1 may correspond to the functions performed by the measuring unit 41, the storage unit 43, and the control unit 45 of the BMS 40. For example, the battery diagnosis apparatus 1 may be configured separately from the battery system 1. For another example, in the battery system 1 as illustrated in FIG. 2, the BMS 40 may perform the function of the battery diagnosis apparatus 1.

The measuring unit 41 is electrically connected to both ends of the battery 10 to measure a battery current and a battery voltage. For example, the measuring unit 41 may be implemented as an Application Specific Integrated Circuit (ASIC) that monitors the battery 10 and measures battery data (voltage, current, and the like) corresponding to the state of the battery 10.

For example, the measuring unit 41 may collect the battery voltage by sensing voltage values of both ends of the battery 10. The measuring unit 41 may receive a battery current value from the current sensor 30. The measuring unit 41 may transmit the battery voltage value and the battery current value to the control unit 150.

The storage unit 43 may store an internal resistance value calculated by the control unit 45 based on at least one of a battery voltage and a battery current at each diagnosis time point for diagnosing a defect in the battery 10. In addition, the control unit 45 may store the battery voltage value and the battery current value received from the measuring unit 41 in the storage unit 43 at each diagnosis time point for diagnosing a defect in the battery.

When the diagnosis time point N according to a preset condition arrives, the control unit 45 calculates a moving average $MA_N$, an upper band threshold $UB_N\_Th$, a lower band threshold $LB_N\_Th$, and internal resistance $DCIR_N$. Also, the control unit 45 may diagnose the state of the battery 10 by comparing the value of the internal resistance $DCIR_N$ with the upper band threshold $UB_N\_Th$ and the lower band threshold $LB_N\_Th$.

First of all, the control unit 45 may extract a plurality of diagnosis time points included in the preset number of samples SN when counting the diagnosis time points in the direction of the previous diagnosis time point based on the current diagnosis time point N and determine a sample group. In this case, the number of samples SN is the number of a plurality of diagnosis time points included in the sample group, and may be determined as an optimal number based on an experiment or the like. The sample group is a subgroup of a plurality of past diagnosis time points, which is a population, and may be a group for calculating a moving average MA and an standard deviation average value σ_ave, which will be described below.

For example, it is assumed that the number of samples SN is 5. In Table 1 above, when the control unit 45 counts the diagnosis time point in the direction of the previous diagnosis time point based on the current diagnosis time point N, the control unit 45 may extract an $N-1^{th}$ diagnosis time point, an $N-2^{th}$ diagnosis time point, an $N-3^{th}$ diagnosis time point, an $N-4^{th}$ diagnosis time point, and an $N-5^{th}$ diagnosis time point corresponding to the sample number SN of 5, and determine the sample group.

The control unit 45 may calculate a moving average $MA_N$, which is an average of internal resistance values of a sample group. For example, referring to Table 1 and Equation 2 above, the control unit 45 may calculate the moving average $MA_N$ of 22.2 corresponding to the current diagnosis time point N by averaging multiple internal resistance values 23Ω, 24Ω, 20Ω, 21Ω, and 23Ωcorresponding to a plurality of diagnosis time points N–5, N–4, N–3, N–2, and N–1, respectively, belonging to the sample group.

For example, referring to Table 1 and Table 3 above, the control unit 45 may calculate an standard deviation average value $σ_{N\_ave}$ (1.70) corresponding to the current diagnosis time point N based on standard deviations $σ_{N-5}$, $σ_{N-4}$, $σ_{N-3}$, $σ_{N-2}$, and $σ_{N-1}$ corresponding to the plurality of diagnosis time points N–5, N–4, N–3, N–2, and N–1, respectively, belonging to the sample group.

The control unit 45 may determine a reference value for diagnosing a battery defect at the current diagnosis time point N, that is, the $N^{th}$ diagnosis time point, based on the internal resistance $DCIR_N$ value calculated at each of a plurality of diagnosis time points N–5, N–4, N–3, N–2, and N–1 belonging to the sample group. In this case, the reference value may include an upper band threshold $UB_N\_Th$ and a lower band threshold $LB_N\_Th$.

The control unit 45 may calculate an upper band threshold $UB_N\_Th$ that is larger than the moving average $MA_N$ by a predetermined value and a lower band threshold $LB_N\_Th$ that is smaller than the moving average MA by a predetermined value. According to the exemplary embodiment, the control unit 45 may calculate a first error value by multiplying the standard deviation average value $σ_{N\_ave}$ by a predetermined first multiple, and calculate the upper band threshold $UB_N\_Th$ by adding the first error value to the moving average $MA_N$. In addition, the control unit 45 may calculate a second error value by multiplying the standard deviation average value $σ_{N\_ave}$ by a predetermined second multiple, and calculate the lower band threshold $LB_N\_Th$ by subtracting the second error value from the moving average $MA_N$. In this case, the first multiple and the second multiple may be the same, but are not limited thereto, and the error value may be calculated as various multiples.

According to the exemplary embodiment, the control unit 45 may calculate an error value ($E=σ_{N\_ave}×Q$) by multiplying the standard deviation average value $σ_{N\_ave}$ that is the average of the standard deviations of the sample group by a predetermined multiple Q. For example, it is assumed that the multiple Q is the natural number 3. The control unit 45 may calculate the upper band threshold $UB_N\_Th$ of 27.3 by adding the error value ($E=σ_{N\_ave}×Q=1.70×3=5.1$)) to the moving average ($MA_N=22.2$) of the sample group as illustrated in Equation 3 above. In addition, the control unit 45 may calculate the lower band threshold $LB_N\_Th$ of 17.1 by subtracting the error value ($E=σ_{N\_ave}×Q=1.70×3=5.1$) from the moving average ($MA_N=22.2$) of the sample group as illustrated in Equation 4 above. In this case, the multiple Q is a value for reflecting a predetermined error, and may be determined by various values through experiments.

Next, the control unit 45 may compare the value of the internal resistance $DCIR_N$ corresponding to the $N^{th}$ diagnosis time point N with the upper band threshold $UB_N\_Th$ and the lower band threshold $LB_N\_Th$ corresponding to the $N^{th}$ diagnosis time point to diagnose a defect in the battery 10.

According to the exemplary embodiment, when the internal resistance $DCIR_N$ value exceeds the upper band threshold $UB_N\_Th$, the control unit 45 may diagnose that a disconnection defect (DD) has occurred in at least one of a plurality of battery cells included in the battery 10. When the value of the internal resistance $DCIR_N$ value is less than the lower band threshold $LB_N\_Th$, the control unit 45 may diagnose that a short defect (SD) has occurred in at least one of a plurality of battery cells included in the battery 10. That is, when the value of the internal resistance $DCIR_N$ value is out of the normal range corresponding to the lower band threshold $LB_N\_Th$ or more and the upper band threshold $UB_N\_Th$ or less, the control unit 45 may diagnose that a defect (disconnection defect or short defect) has occurred in the battery 10. In addition, when the value of the internal resistance $DCIR_N$ value falls within the normal range, the control unit 45 may diagnose the state of the battery as normal.

For example, as described above through Tables 1 and 3 and Equations 1 to 4, the internal resistance $DCIR_N$ value, the upper band threshold $UB_N\_Th$, and the lower band threshold $LB_N\_Th$ corresponding to the $N^{th}$ diagnosis time point N may be calculated as $30\Omega$, 27.3, and 17.1, respectively. In this case, the control unit 45 may diagnose a defect (disconnection defect) of the battery 10 based on the fact that the internal resistance value ($DCIR_N$=30) exceeds the upper band threshold ($UB_N\_Th$=27.3).

FIG. 3 is an exemplary diagram in which a moving average, an upper band threshold, and a lower band threshold calculated for each of a plurality of diagnosis time points are accumulated and displayed.

Hereinafter, an example of calculating the moving average $MA_N$, the upper band threshold $UB_N\_Th$, and the lower band threshold $LB_N\_Th$ will be described based on FIGS. 1 to 3 and Tables 1 and 3.

The BMS 40 may determine a sample group by extracting a plurality of diagnosis time points which is adjacent to the diagnosis time point N while being in an environment similar to the predetermined diagnosis time point N. The BMS 40 may calculate an upper band threshold $UB_N\_Th$ and a lower band threshold $LB_N\_Th$ corresponding to the diagnosis time point N based on the moving average $MA_N$, which is the average of a plurality of internal resistance values belonging to the sample group, and the standard deviation average value $\sigma_{N\_ave}$, which is the average of a plurality of standard deviations.

According to the exemplary embodiment, first, When the BMS 40 counts the diagnosis time point in the direction of the previous diagnosis time point based on the predetermined diagnosis time point N, the BMS 40 may extract an $N-1^{th}$ diagnosis time point, an $N-2^{th}$ diagnosis time point, an $N-3^{th}$ diagnosis time point, an $N-4^{th}$ diagnosis time point, and an $N-5^{th}$ diagnosis time point corresponding to the sample number SN of 5.

Next, the BMS 40 may calculate a moving average (($23\Omega$+$24\Omega$+$20\Omega$+$21\Omega$+$23\Omega$)/5=$22.2\Omega$) corresponding to the diagnosis time point N by averaging the plurality of internal resistance values ($23\Omega$, $24\Omega$, $20\Omega$, $21\Omega$, and $23\Omega$) corresponding to the plurality of extracted diagnosis time points N–5, N–4, N–3, N–2, and N–1, respectively.

Through Table 3, Equation 3, and Equation 4 described above, the BMS 40 may calculate the upper band threshold 27.3 and the lower band threshold 17.1.

Next, the BMS 40 may diagnose a defect in the battery 10 by comparing the value of the internal resistance $DCIR_N$ with the upper band threshold $UB_N\_Th$ and the lower band threshold $LB_N\_Th$. In this case, it is assumed that the internal resistance $DCIR_N$ is $30\Omega$, for example. The BMS 40 may diagnose a battery defect (disconnection defect) based on the fact that the internal resistance value ($DCIR_N$=30) exceeds the upper band threshold ($UB_N\_Th$=27.3).

The internal resistance band (DCIR Band) illustrated in FIG. 3 may be derived by connecting the moving average MA, the upper band threshold UB_Th, and the lower band threshold LB_Th calculated at each diagnosis time point. The internal resistance band (DCIR Band) may exhibit a trend of an internal resistance value that changes as the battery 10 is used.

FIG. 4 is a flowchart illustrating a battery diagnosis method according to an exemplary embodiment.

Hereinafter, a battery diagnosis method, a battery diagnosis apparatus and a battery system for providing the method will be described with reference to FIGS. 1 to 4. A battery diagnosis method performed in the battery system 2 described below may be equally applied to the battery diagnosis apparatus 1.

First, the BMS 40 collects battery data (S100). In this case, the battery data may include a battery voltage, which is a voltage of both ends of the battery 10, and a battery current, which is a current flowing through the battery 10.

For example, the battery voltage and the battery current may be battery data required to calculate Direct Current Internal Resistance (DCIR) of the battery.

Next, the BMS 40 determines a sample group by extracting a plurality of diagnosis time points adjacent to a predetermined diagnosis time point N (S200).

When the BMS 40 counts the diagnosis time point in the direction of the previous diagnosis time point based on a predetermined diagnosis time point N, that is, the $N^{th}$ diagnosis time point, the BMS 40 may extract a plurality of diagnosis time points corresponding to the preset number of samples SN to determine a sample group.

For example, it is assumed that the number of samples SN is 5. In Table 1 above, when the BMS 40 counts the diagnosis time point in the direction of the previous diagnosis time point based on the $N^{th}$ diagnosis time point, the BMS 40 may extract an $N-1^{th}$ diagnosis time point, an $N-2^{th}$ diagnosis time point, an $N-3^{th}$ diagnosis time point, an $N-4^{th}$ diagnosis time point, and an $N-5^{th}$ diagnosis time point corresponding to the sample number SN of 5, and determine the sample group.

Next, the BMS 40 determines a reference value for the diagnosis of a defect of the battery 10 (S300). According to the exemplary embodiment, the reference value may include an upper band threshold $UB_N\_Th$ and a lower band threshold $LB_N\_Th$.

In operation S300, referring to FIG. 5, the BMS 40 averages internal resistance values corresponding to a plurality of diagnosis time points belonging to the sample group to calculate a moving average $MA_N$ of the sample group (S310).

Referring to Table 1 and Equation 2 above, the BMS 40 may calculate the moving average $MA_N$ of 22.2 corresponding to the diagnosis time point N by averaging multiple internal resistance values $23\Omega$, $24\Omega$, $20\Omega$, $21\Omega$, and $23\Omega$ corresponding to a plurality of diagnosis time points N–5, N–4, N–3, N–2, and N–1, respectively, belonging to the sample group.

In operation S300, the BMS 40 calculates an error value E based on the standard deviation average value $\sigma_{N\_ave}$ of the sample group (S320).

For example, the standard deviation average value $\sigma_{N\_ave}$ of the sample group may be calculated by averaging the plurality of standard deviations $\sigma_{N-5}$, $\sigma_{N-4}$, $\sigma_{N-3}$, $\sigma_{N-2}$, and $\sigma_{N-1}$ corresponding to the plurality of diagnosis time points N–5, N–4, N–3, N–2, and N–1, respectively, belonging to the sample group.

Referring to Table 1 and Table 3 above, the BMS 40 may calculate an standard deviation average value $\sigma_{N\_ave}$ of 1.70 corresponding to the $N^{th}$ diagnosis time point N based on the plurality of standard deviations $\sigma_{N-5}$, $\sigma_{N-4}$, $\sigma_{N-3}$, $\sigma_{N-2}$, and $\sigma_{N-1}$ corresponding to the plurality of diagnosis time points N–5, N–4, N–3, N–2, and N–1, respectively, belonging to the sample group. In addition, the BMS 40 may calculate an error value ($E=\sigma_{N\_ave}Q$=1.70×3=5.1) by multiplying the standard deviation average value $\sigma_{N\_ave}$ by a predetermined multiple Q. In this case, the multiple Q is a value for reflecting a predetermined error, and may be determined by various values through experiments. For example, it is assumed that the multiple Q is the natural number 3.

In operation S300, the BMS 40 calculates an upper band threshold $UB_N\_Th$ and a lower band threshold $LB_N\_Th$ based on the moving average $MA_N$ and the error value E (S330).

Referring to Equation 3, the BMS 40 may calculate the upper band threshold $UB_{N\_}Th$ of 27.3 by adding the error value ($E=\sigma_{N\_ave}\times Q=1.70\times 3=5.1$) to the moving average ($MA_N=22.2$) of the sample group. Further, referring to Equation 4, the BMS 40 may calculate the lower band threshold $LB_{N\_}Th$ of 17.1 by subtracting the error value ($E=\sigma_{N\_ave}\times Q=1.70 \times 3=5.1$) from the moving average ($MA_N=22.2$) of the sample group.

Next, the BMS 40 compares the value of the internal resistance $DCIR_N$ corresponding to the current diagnosis time point N with the upper band threshold $UB_{N\_}Th$ and the lower band threshold $LB_{N\_}Th$ corresponding to the current diagnosis time point N, so that the battery 10 diagnoses a defect of the battery 10 (S400).

The BMS 40 may calculate the internal resistance $DCIR_N$ value corresponding to the $N^{th}$ diagnosis time point based on the battery voltage, which is the voltage of the both ends of the battery, and the battery current, which is the current flowing through the battery. Also, the value of the internal resistance $DCIR_N$ may be calculated in operation S200 or operation S300.

For example, the BMS 40 may calculate a voltage difference ($\Delta V=|V1-V2|$) between a battery voltage V1 corresponding to a first time point when charging starts and a battery voltage V2 corresponding to a second time point after a predetermined time has elapsed from the first time point. The BMS 40 may calculate the internal resistance $DCIR_N$ value based on the charging current I flowing through the battery 10 and the voltage difference $\Delta V$. For example, it is assumed that the internal resistance $DCIR_N$ value corresponding to the $N^{th}$ diagnosis time point is calculated as 300.

In operation S400, the BMS 40 determines whether the value of the internal resistance $DCIR_N$ exceeds the upper band threshold $UB_{N\_}Th$ (S410).

In operation S400, when the determination result is exceeded (S410, YES), the BMS 40 diagnoses that a disconnection defect has occurred in at least one of a plurality of battery cells included in the battery 10 (S420).

For example, when the parallel connection of some battery cells among a plurality of battery cells connected in parallel is disconnected, the internal resistance value of the battery 10 may increase.

In operation S400, when the determination result does not exceed (S410, NO), the BMS 40 determines whether the internal resistance $DCIR_N$ value is less than the lower band threshold $LB_{N\_}Th$ (S430).

In operation S400, when the internal resistance value is less than the lower band threshold as a result of the determination result (S430, YES), the BMS 40 diagnoses that a short defect has occurred in at least one of a plurality of battery cells included in the battery 10 (S440).

For example, when the parallel connection of some battery cells among a plurality of battery cells connected in parallel has short, the internal resistance value that is the entire resistance of the battery 10 may increase.

In operation S400, when the internal resistance value is equal to or greater than the lower band threshold as a result of the determination result (S430, NO), the BMS 40 diagnoses the state of the battery 10 as normal (S450).

When the value of the internal resistance $DCIR_N$ is out of the normal range corresponding to the lower band threshold $LB_{N\_}Th$ or more and the upper band threshold $UB_{N\_}Th$ or less, the BMS 40 may diagnose the state of the battery 10 as a defect (disconnection defect or short defect). In addition, when the value of the internal resistance $DCIR_N$ value falls within the normal range, the BMS 40 may diagnose the state of the battery as normal.

While this invention has been described in connection with what is presently considered to be practical exemplary embodiments, it is to be understood that the invention is not limited to the disclosed exemplary embodiments.

The invention claimed is:

1. A battery diagnosis apparatus, comprising:
a measuring unit configured to measure a battery voltage at opposite ends of a battery including a plurality of battery cells, and a battery current flowing through the battery;
a storage unit configured to store an internal resistance value of the battery that is calculated based on at least one of the battery voltage and the battery current at each diagnosis time point; and
a control unit configured to extract a plurality of previous diagnosis time points corresponding to a predetermined number of samples based on a diagnosis time point for the each diagnosis time point, calculate a moving average that is an average of a plurality of internal resistance values corresponding to the plurality of diagnosis time points, respectively, the plurality of internal resistance value including the internal resistance value, and compare the internal resistance value with an upper band threshold that is larger than the moving average by a predetermined value and a lower band threshold that is smaller than the moving average by a predetermined value to diagnose a defect in the battery,
wherein the control unit is further configure to:
  calculate an error value by multiplying a standard deviation average value, which is an average of a plurality of standard deviations corresponding to the plurality of diagnosis time points, respectively, by a predetermined multiple,
  calculate the upper band threshold by adding the error value to the moving average, and
  calculate the lower band threshold by subtracting the error value from the moving average.

2. The battery diagnosis apparatus of claim 1, wherein:
when the internal resistance value exceeds the upper band threshold,
the control unit diagnoses that a disconnection defect has occurred in at least one of the plurality of battery cells.

3. The battery diagnosis apparatus of claim 1, wherein:
when the internal resistance value is less than the lower band threshold,
the control unit diagnoses that a short defect has occurred in at least one of the plurality of battery cells.

4. The battery diagnosis apparatus of claim 1, wherein:
when the internal resistance value is within a range that is equal to or greater than the lower band threshold and is equal to or less than the upper band threshold,
the control unit diagnoses that the plurality of battery cells is in a normal state.

5. A battery system, comprising:
a battery including a plurality of battery cells;
a measuring unit configured to measure a battery voltage at opposite ends of the battery, and a battery current flowing through the battery;
a storage unit configured to store an internal resistance value of the battery calculated based on the battery voltage and the battery current at each diagnosis time point; and a control unit configured to extract a plurality of previous diagnosis time points corresponding to a predetermined number of samples based on a diagnosis time point for the each diagnosis time point, calculate a moving average that is an average of a plurality of internal resistance values corresponding to the plurality of diagnosis time points, respectively, the plurality of internal resistance values including the internal resistance value, and compare the internal resistance value with an upper band threshold that is larger than the moving average by a predetermined value and a lower band threshold that is smaller than the moving average by a predetermined value to diagnose a defect in the battery, wherein the control unit is further configured to:

calculate an error value by multiplying a standard deviation average value, which is an average of a plurality of standard deviations corresponding to the plurality of diagnosis time points, respectively, by a predetermined multiple, calculate the upper band threshold by adding the error value to the moving average, and calculate the lower band threshold by subtracting the error value from the moving average.

6. The battery system of claim 5, wherein:

when the internal resistance value exceeds the upper band threshold, the control unit diagnoses that a disconnection defect has occurred in at least one of the plurality of battery cells.

7. The battery system of claim 5, wherein:

when the internal resistance value is less than the lower band threshold, the control unit diagnoses that a short defect has occurred in at least one of the plurality of battery cells.

8. A battery diagnosing method, comprising:

a battery data collecting operation of collecting a measurement value of each of a battery voltage at opposite ends of a battery including a plurality of battery cells, and a battery current flowing through the battery;

a sample group determining operation of extracting, at a predetermined diagnosis time point, a plurality of diagnosis time points previously obtained and corresponding to a number of samples based on the predetermined diagnosis time point;

a reference value determining operation of calculating a moving average, which is an average of a plurality of internal resistance values corresponding to the plurality of diagnosis time points, respectively, an upper band threshold larger than the moving average by a predetermined value, and a lower band threshold smaller than the moving average by a predetermined value; and a defect diagnosis operation of diagnosing a defect in the battery by comparing an internal resistance value corresponding to the predetermined diagnosis time point with the upper band threshold and the lower band threshold, from among the plurality of internal resistance values, wherein the reference value determining operation includes:

calculating an error value by multiplying a standard deviation average value, which is an average of a plurality of standard deviations corresponding to the plurality of diagnosis time points, respectively, by a predetermined multiple, calculating the upper band threshold by adding the error value to the moving average, and calculating the lower band threshold by subtracting the error value from the moving average.

9. The battery diagnosis method of claim 8, wherein the defect diagnosing operation includes:

when the internal resistance value exceeds the upper band threshold, diagnosing that a disconnection defect has occurred in at least one of the plurality of battery cells.

10. The battery diagnosis method of claim 8, wherein the defect diagnosing operation includes:

when the internal resistance value is less than the lower band threshold, diagnosing that a short defect has occurred in at least one of the plurality of battery cells.

* * * * *